(12) United States Patent
Machida

(10) Patent No.: US 10,809,012 B2
(45) Date of Patent: Oct. 20, 2020

(54) HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 179 days.

(21) Appl. No.: 16/149,480

(22) Filed: Oct. 2, 2018

(65) Prior Publication Data

US 2019/0162481 A1 May 30, 2019

(30) Foreign Application Priority Data

Nov. 29, 2017 (JP) .................................. 2017-229530

(51) Int. Cl.
*F28D 15/02* (2006.01)
*F28D 15/04* (2006.01)
*F28D 21/00* (2006.01)

(52) U.S. Cl.
CPC ..... *F28D 15/0283* (2013.01); *F28D 15/0266* (2013.01); *F28D 15/04* (2013.01); *F28D 15/043* (2013.01); *F28D 15/046* (2013.01); *F28D 2021/0028* (2013.01)

(58) Field of Classification Search
CPC .. F28D 15/0283; F28D 15/0266; F28D 15/04; F28D 15/043; F28D 15/046; F28D 2021/0028
See application file for complete search history.

(56) References Cited

U.S. PATENT DOCUMENTS

| 3,680,189 | A | * | 8/1972 | Noren | .................... | B21D 53/02 |
| | | | | | | 29/890.032 |
| 6,725,910 | B2 | * | 4/2004 | Ishida | ................... | B21C 37/151 |
| | | | | | | 165/104.21 |
| 7,229,104 | B2 | * | 6/2007 | Hsu | ..................... | F28D 15/0283 |
| | | | | | | 165/104.26 |
| 10,408,546 | B2 | * | 9/2019 | Kurashima | ........... | H01L 23/427 |
| 2001/0047859 | A1 | | 12/2001 | Ishida et al. | | |

(Continued)

FOREIGN PATENT DOCUMENTS

| JP | H11-183069 | 7/1999 |
| JP | 6146484 | 6/2017 |

OTHER PUBLICATIONS

Extended European Search Report dated Apr. 25, 2019 issued with respect to the corresponding European Patent Application No. 18200105.7.

*Primary Examiner* — Jon T. Schermerhorn, Jr.

(74) *Attorney, Agent, or Firm* — IPUSA, PLLC

(57) ABSTRACT

A heat pipe includes an intermediate metal layer interposed between outermost metal layers, an inlet passage defined by opposing wall portions of the intermediate metal layer and the outermost metal layers, and a porous body provided at one or both of the wall portions. The porous body includes a first bottomed hole that caves in from one surface of the intermediate metal layer, a second bottomed hole that caves in from the other surface of the intermediate metal layer, and a pore formed by the first bottomed hole that partially communicates with the second bottomed hole. The outermost metal layers, the intermediate metal layer, the inlet passage, and the porous body form an inlet for filling a working fluid into the heat pipe.

6 Claims, 10 Drawing Sheets

(56) References Cited

U.S. PATENT DOCUMENTS

| | | |
|---|---|---|
| 2002/0179288 A1 | 12/2002 | Ishida et al. |
| 2003/0205363 A1 | 11/2003 | Chu et al. |
| 2015/0077929 A1 | 3/2015 | Honmura et al. |
| 2016/0259383 A1* | 9/2016 | Shioga .................... G06F 1/203 |
| 2018/0058767 A1* | 3/2018 | Machida ............. F28D 15/0233 |

* cited by examiner

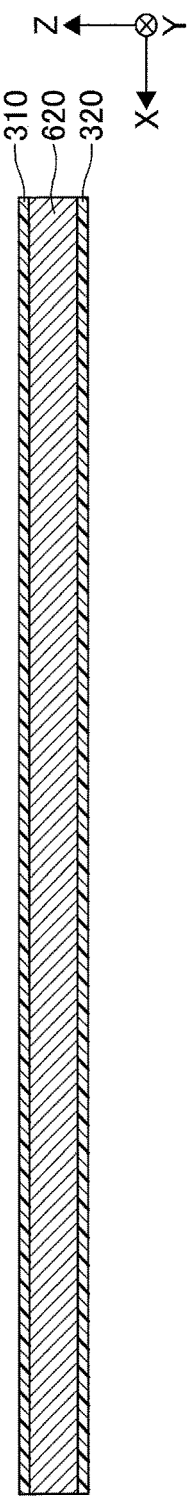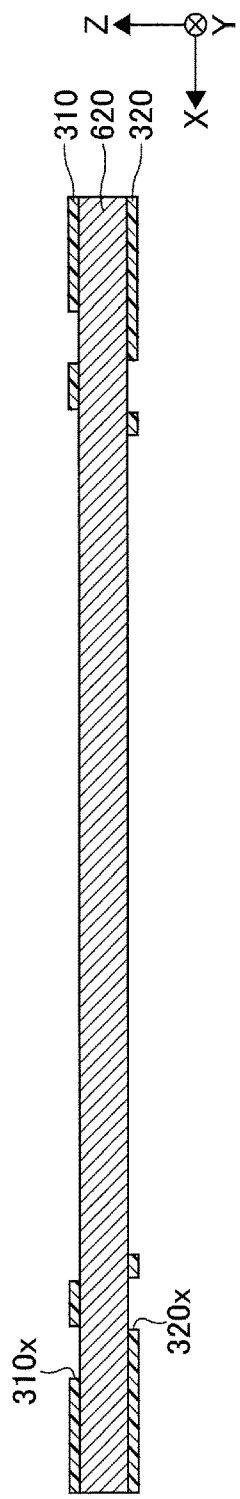

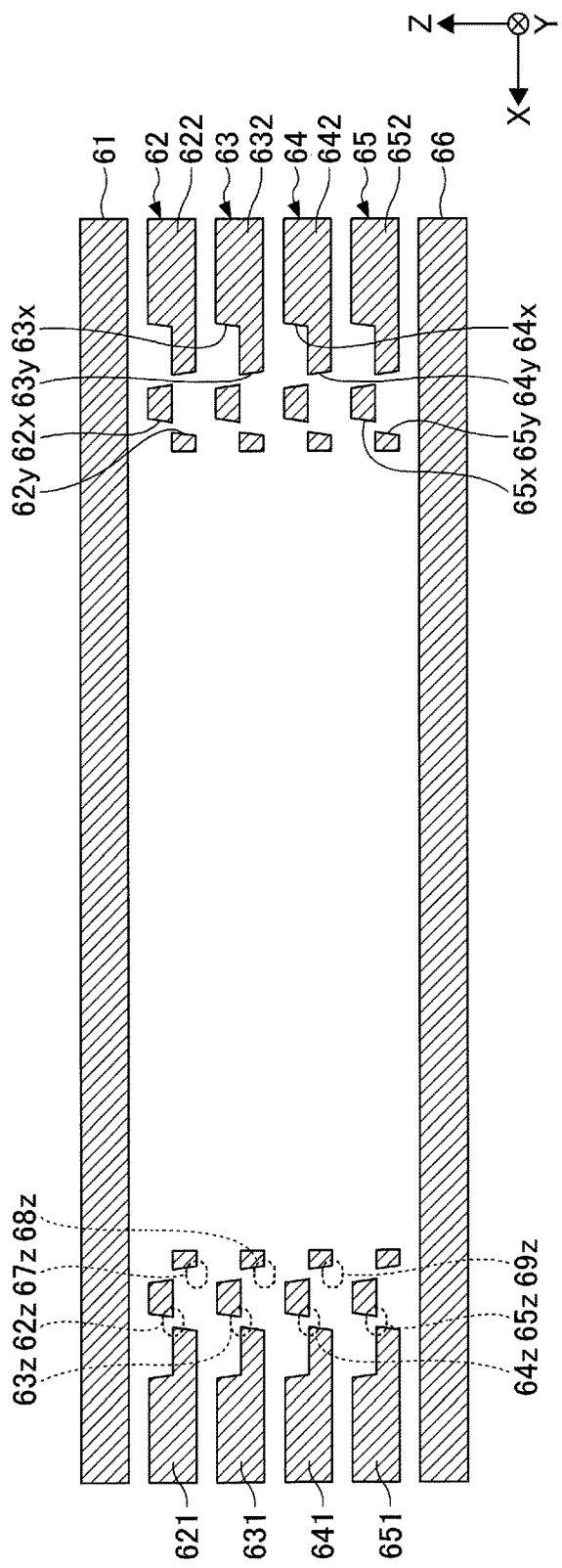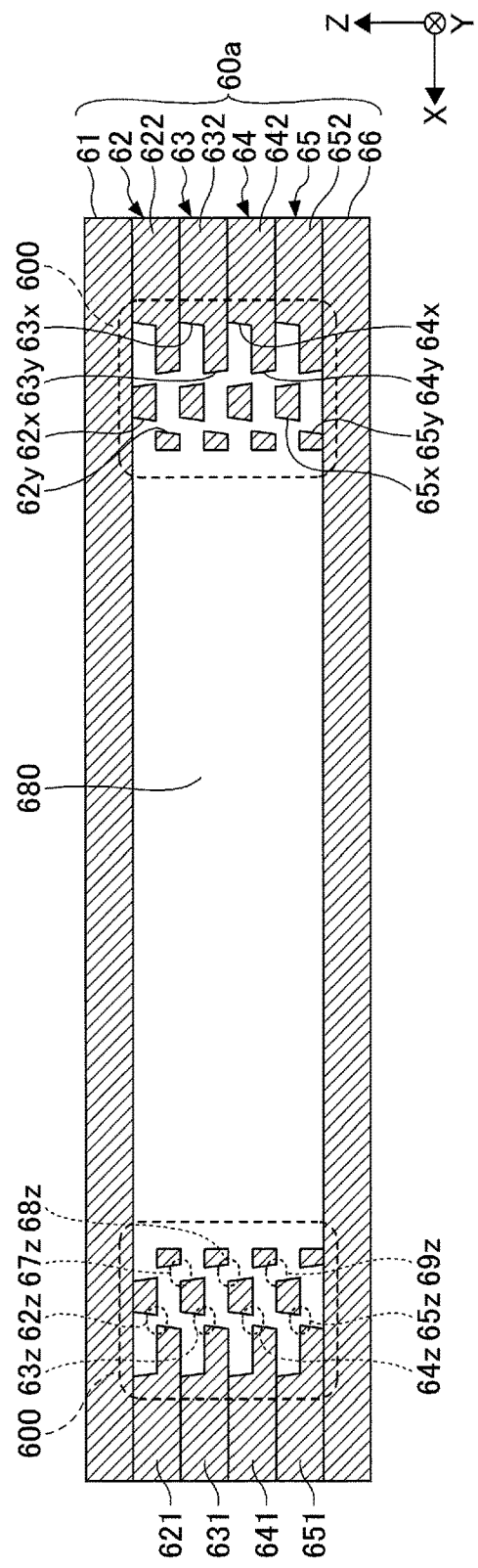

ic pipe

HEAT PIPE

CROSS-REFERENCE TO RELATED APPLICATION

This application is based upon and claims the benefit of priority of the prior Japanese Patent Application No. 2017-229530, filed on Nov. 29, 2017, the entire contents of which are incorporated herein by reference.

FIELD

Certain aspects of the embodiments discussed herein are related to a heat pipe and a method of manufacturing the heat pipe.

BACKGROUND

The heat pipe is a known device for cooling a heat generating component, such as a CPU (Central Processing Unit) or the like, mounted in an electronic apparatus. The heat pipe is a device that transfers heat by utilizing a phase change of a working fluid.

The working fluid is filled into the heat pipe through an inlet provided on one end of the heat pipe, and the inlet is thereafter sealed.

There are demands to reduce a thickness of a mobile electronic device, and accordingly, there are demands to reduce a thickness of the heat pipe that is mounted on the mobile electronic device. When the thickness of the heat pipe is reduced, the inlet through which the working fluid is filled is also reduced.

However, in the conventional heat pipe, the inlet is simply a space, and does not have a function of drawing in the working fluid into the heat pipe. For this reason, when the inlet is small, it is difficult to stably fill the working fluid into the heat pipe through the inlet.

As an example, International Publication No. WO2015/087451A1 (or Japanese Patent No. 6146484) proposes one example of a conventional loop heat pipe.

SUMMARY

Accordingly, it is an object in one aspect of the embodiments to provide a heat pipe and a method of manufacturing the heat pipe, which can stably fill the working fluid into the heat pipe.

According to one aspect of the embodiments, a heat pipe includes an inlet for filling a working fluid into the heat pipe, and including a first outermost metal layer; a second outermost metal layer; an intermediate metal layer interposed between the first and second outermost metal layers; an inlet passage defined by opposing wall portions of the intermediate metal layer, and the first and second outermost metal layers; and a porous body provided at one or both of the wall portions, wherein the porous body includes a first bottomed hole that caves in from one surface of the intermediate metal layer, a second bottomed hole that caves in from the other surface of the intermediate metal layer, and a pore formed by the first bottomed hole that partially communicates with the second bottomed hole.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 4A, FIG. 4B, FIG. 4C, and FIG. 4D are diagrams illustrating an example of manufacturing stages of the loop heat pipe in the first embodiment;

FIG. 5A and FIG. 5B are diagrams illustrating an example of the manufacturing stages of the loop heat pipe in the first embodiment;

DESCRIPTION OF EMBODIMENTS

Figure 1:
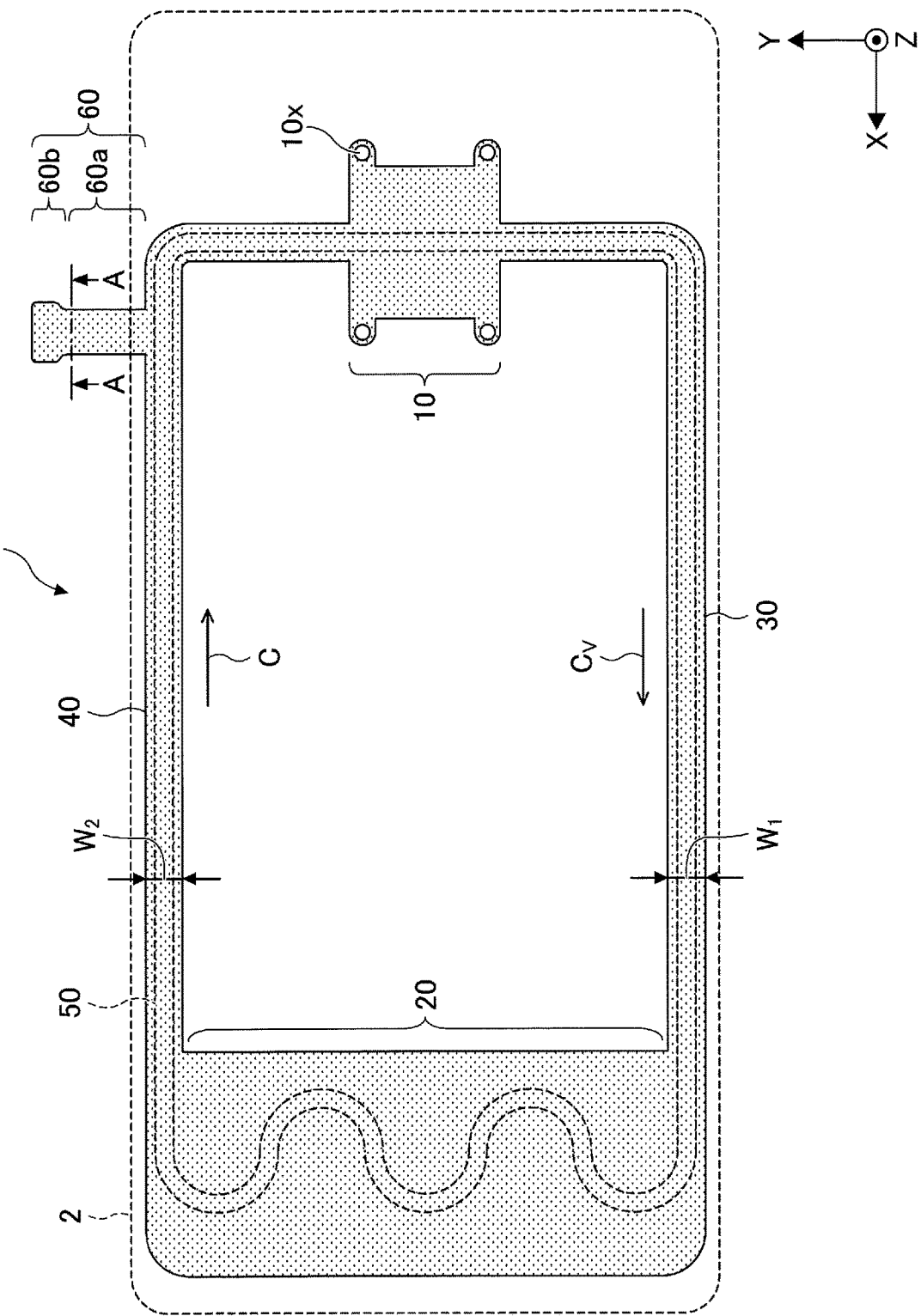
FIG. 1 is a plan view schematically illustrating an example of a loop heat pipe in a first embodiment.

Preferred embodiments of the present invention will be described with reference to the accompanying drawings. In the drawings, those parts that are the same are designated by the same reference numerals, and a repeated description of the same parts may be omitted.

A description will now be given of embodiments and modifications of the heat pipe and the method of manufacturing the heat pipe according to the present invention.

First Embodiment

In the first embodiment, the present invention is applied to a loop heat pipe, for example.

[Structure of Loop Heat Pipe in First Embodiment]

First, a structure of the loop heat pipe in the first embodiment will be described. FIG. 1 is a plan view schematically illustrating an example of the loop heat pipe in the first embodiment.

As illustrated in FIG. 1, a loop heat pipe 1 includes an evaporator 10, a condenser 20, a vapor pipe 30, a liquid pipe 40, and an inlet 60. The loop heat pipe 1 may be accommodated in a mobile electronic device 2, such as a smartphone, a tablet terminal, or the like, for example.

In the loop heat pipe 1, the evaporator 10 has a function to vaporize a working fluid C and generate vapor Cv. The condenser 20 has a function to liquefy the vapor Cv of the working fluid C. The evaporator 10 and the condenser 20 are connected via the vapor pipe 30 and the liquid pipe 40, and the vapor pipe 30 and the liquid pipe 40 form a loop-shaped passage (or channel) 50 in which the working liquid C or the vapor Cv flows.

The inlet 60 is an inlet through which the working fluid C is filled into the liquid pipe 40. After filling the working fluid C into the liquid pipe 40, the inlet 60 is hermetically sealed. Details of the inlet 60 will be described later. In this embodiment, the inlet 60 is connected to the liquid pipe 40. However, the inlet 60 may be connected to the condenser 20 or the vapor pipe 30. In such a case, the working fluid C filled into the condenser 20 or the vapor pipe 30 flows inside the passage 50 and moves into the liquid pipe 40.

Figure 2:
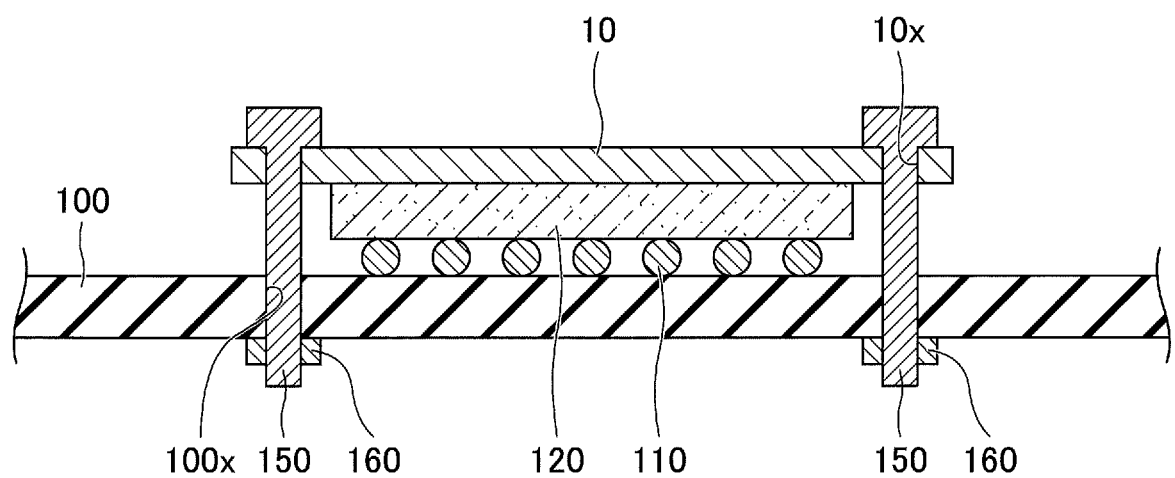
FIG. 2 is a cross sectional view illustrating an evaporator and its surrounding of the loop heat pipe in the first embodiment.

FIG. 2 is a cross sectional view illustrating an evaporator and its surrounding of the loop heat pipe in the first embodiment. As illustrated in FIG. 1 and FIG. 2, the evaporator 10 includes four through-holes 10x, for example. A bolt 150 is inserted into each through-hole 10x of the evaporator 10 and a corresponding through-hole 100x formed in a circuit board (or substrate) 100, and a tip of each bolt 150 is fastened by a nut 160 at a lower surface of the circuit board 100 in FIG. 2, to fix the evaporator 10 on the circuit board 100.

A heat generating component 120, which is an electronic component such as a CPU or the like, for example, is mounted on the circuit board 100 via bumps 110. An upper surface of the heat generating component 120 makes contact with a lower surface of the evaporator 10. The working fluid C inside the evaporator 10 is vaporized by the heat generated from the heat generating component 120, to generate the vapor Cv.

The vapor Cv generated from the evaporator 10 passes through the vapor pipe 30 and is guided to the condenser 20, to be liquefied by the condenser 20. Hence, the heat generated from the heat generating component 120 is transferred to the condenser 20, to reduce a temperature rise of the heat generating component 120. The working fluid C, liquefied by the condenser 20, passes through the liquid pipe 40 and is guided to the evaporator 10. A width $W_1$ of the vapor pipe 30 may be approximately 8 mm, for example. In addition, a width $W_2$ of the liquid pipe 40 may be approximately 6 mm, for example.

The working fluid C is not limited to a particular type of fluid. From a viewpoint of efficiently cooling the heat generating component 120 by latent heat of vaporization, a fluid with a high vapor pressure and a large latent heat of vaporization is preferably used as the working fluid C. Examples of such a fluid, preferably used as the working fluid C, include ammonia, water, fluorocarbon, alcohol, and acetone, for example.

The evaporator 10, the condenser 20, the vapor pipe 30, the liquid pipe 40, and the inlet 60 form an integral structure that is formed by successively stacking a plurality of metal layers. The metal layers are copper layers having a high thermal conductivity, for example, and the metal layers are directly bonded to each other by solid-phase (or solid-state) welding or the like. Each of the metal layers has a thickness of approximately 50 μm to approximately 200 μm, for example.

Of course, the metal layers are not limited to the copper layers, and may be stainless steel layers, aluminum layers, magnesium alloy layers, or the like, for example. In addition, the number of metal layers that are stacked is not limited to a particular number.

Figure 3A:
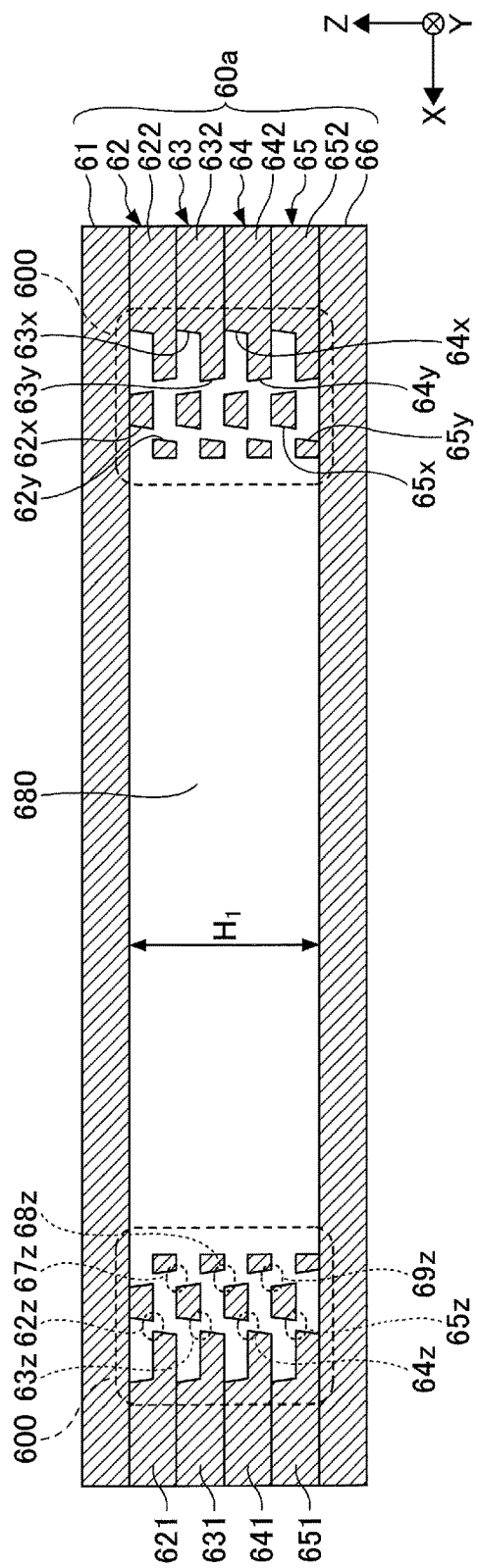
FIG. 3A and FIG. 3B are diagrams illustrating an example of a structure of an inlet of the loop heat pipe in the first embodiment.
Figure 3B:
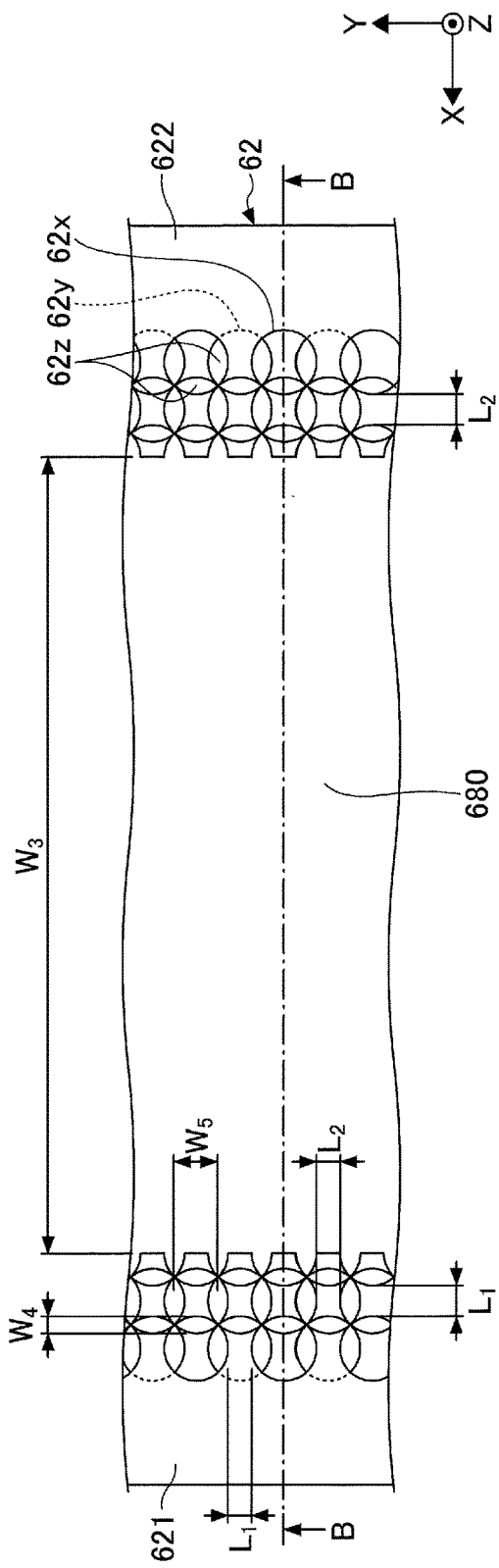

FIG. 3A and FIG. 3B are diagrams illustrating an example of a structure of the inlet of the loop heat pipe in the first embodiment. FIG. 3A is a cross sectional view along a line A-A in FIG. 1. In addition, FIG. 3B is a partial plan view illustrating an example of an arrangement of bottomed holes in an intermediate metal layer 62. A cross sectional view along a line B-B in FIG. 3B corresponds to a part of the intermediate metal layer 62 illustrated in FIG. 3A.

As illustrated in FIG. 1, FIG. 3A, and FIG. 3B, the inlet 60 includes a non-sealed portion 60a connected to the liquid pipe 40, and a sealed portion 60b connected to the non-sealed portion 60a. The liquid pipe 40, the non-sealed portion 60a, and the sealed portion 60b are integrally formed.

The non-sealed portion 60a approximately maintains a shape that is the same as a shape at a time when the working fluid C is filled into the liquid pipe 40. When filling the working fluid C into the liquid pipe 40, the sealed portion 60b has a shape similar to the shape of the non-sealed portion 60a. The sealed portion 60b is pressed and flattened after the working fluid C is filled into the liquid pipe 40. By pressing and flattening the sealed portion 60b, the working fluid C filled into the liquid pipe 40 is hermetically sealed so as not to leak outside the liquid pipe 40.

The inlet 60 may have a stacked structure in which six metal layers, namely, an outermost metal layer 66, an intermediate metal layer 65, an intermediate metal layer 64, an intermediate metal layer 63, an intermediate metal layer 62, and an outermost metal layer 61, are successively stacked, for example. In a case in which it is unnecessary to distinguish the outermost metal layers and the intermediate metal layers, both the outermost metal layers and the intermediate metal layers may generally be referred to simply as a "metal layer".

The outermost metal layers 61 and 66 are positioned on respective outer sides of the stacked structure made up of the six metal layers and forming the inlet 60. The intermediate metal layers 62 through 65 are successively stacked and positioned between the outermost metal layer 61 and the outermost metal layer 66. In this embodiment, each of the outermost metal layers 61 and 66 is a continuous layer having no holes or grooves, and forms a part of an outer wall of the inlet 60.

The number of metal layers forming the stacked structure is not limited to six, and the number of metal layers forming the stacked structure may be at least three or more. In other words, the stacked structure may be made up of three or more metal layers, such that one or more intermediate metal layers are sandwiched between the two outermost metal layers.

The outermost metal layers 61 and 66 and the intermediate metal layers 62 through 65 are copper layers having a high thermal conductivity, for example, and are directly bonded to each other by solid-phase welding or the like. The outermost metal layers 61 and 66 and the intermediate metal layers 62 through 65 respectively have a thickness of approximately 50 μm to approximately 200 μm, for example. Of course, the outermost metal layers 61 and 66 and the intermediate metal layers 62 through 65 are not limited to the copper layers, and may be stainless steel layers, aluminum layers, magnesium alloy layers, or the like, for example.

The non-sealed portion 60a includes an inlet passage 680 for filling the working fluid C into the liquid pipe 40. A width $W_3$ of the inlet passage 680 may be approximately 2 mm to approximately 6 mm, for example. A height $H_1$ of the inlet passage 680 may be approximately 0.2 mm to approximately 0.6 mm, for example.

The intermediate metal layer 62 includes wall portions 621 and 622 that are separated from each other in a X-direction and are arranged to oppose each other. The intermediate metal layer 63 includes wall portions 631 and 632 that are separated from each other in the X-direction and are arranged to oppose each other. The intermediate metal layer 64 includes wall portions 641 and 642 that are separated from each other in the X-direction and are arranged to oppose each other. The intermediate metal layer 65 includes wall portions 651 and 652 that are separated from each other in the X-direction and are arranged to oppose each other.

The wall portions 621 and 622 of the intermediate metal layer 62, the wall portions 631 and 632 of the intermediate metal layer 63, the wall portions 641 and 642 of the intermediate metal layer 64, and the wall portions 651 and 652 of the intermediate metal layer 65 form a part of the outer wall of the inlet 60. The inlet passage 680 is defined by the wall portions 621 and 622, the wall portions 631 and 632, the wall portions 641 and 642, the wall portions 651 and 652, and the outermost metal layers 61 and 66.

A porous body 600 is provided on the inlet passage 680 side of an end of each of the wall portions 621 and 622, the wall portions 631 and 632, the wall portions 641 and 642, and the wall portions 651 and 652. Although FIG. 3A illustrates the non-sealed portion 60a, the sealed portion 60b has a structure similar to the structure illustrated in FIG. 3A before the sealed portion 60b is pressed and flattened. In other words, when filling the working fluid C, the entire inlet 60, including the non-sealed portion 60a and the sealed portion 60b, has the structure illustrated in FIG. 3A.

As illustrated in FIG. 3A, at the porous body 600, the inlet passage 680 side of an end of the wall portions 621 and 622 of the intermediate metal layer 62 includes a plurality of bottomed holes 62x and a plurality of bottomed holes 62y. The bottomed holes 62x cave in from an upper surface toward an approximately central part in a thickness direction of the intermediate metal layer 62. The bottomed holes 62y cave in from a lower surface toward the approximately central part in the thickness direction of the intermediate metal layer 62.

The bottomed holes 62x and the bottomed holes 62y are alternately arranged in the X-direction in the plan view. In addition, the bottomed holes 62x and the bottomed holes 62y are alternately arranged in a Y-direction in the plan view. The bottomed holes 62x and the bottomed holes 62y that are alternately arranged in the X-direction, partially overlap in the plan view, and the partially overlapping parts of the bottomed hole 62x and the bottomed hole 62y communicate with each other to form a pore 62z. Further, the bottomed holes 62x and the bottomed holes 62y that are alternately arranged in the Y-direction, partially overlap in the plan view, and the partially overlapping parts of the bottomed hole 62x and the bottomed hole 62y communicate with each other to form the pore 62z. In other words, the bottomed holes 62x partially communicate with the bottomed holes 62y, to form the pores 62z.

The bottomed holes 62x and the bottomed holes 62y may have a circular shape having a diameter of approximately 100 µm to approximately 300 µm, for example. However, the bottomed holes 62x and the bottomed holes 62y may have an arbitrary shape, including an oval shape, a polygonal shape, or the like. A depth of the bottomed holes 62x and 62y may be approximately one-half the thickness of the intermediate metal layer 62, for example. A gap (or distance) $L_1$ between two mutually adjacent bottomed holes 62x along both the X-direction and the Y-direction may be approximately 100 µm to approximately 400 µm, for example. A gap (or distance) $L_2$ between two mutually adjacent bottomed holes 62y along both the X-direction and the Y-direction may be approximately 100 µm to approximately 400 µm, for example.

Inner walls of the bottomed holes 62x and 62y may have a tapered shape that spreads from a bottom of the bottomed hole towards an opening of the bottomed hole. However, the inner walls of the bottomed holes 62x and 62y are not limited to the tapered shape, and may be vertical with respect to the bottom surface. In addition, the inner walls of the bottomed holes 62x and 62y may be curved surfaces having a semi-circular shape. A width $W_4$ of the pore 62z along a lateral direction may be approximately 10 µm to approximately 50 µm, for example. A width $W_5$ of the pore 62z along a longitudinal direction may be approximately 50 µm to approximately 150 µm, for example.

Similarly, the inlet passage 680 side of an end of the wall portions 631 and 632 of the intermediate metal layer 63 includes a plurality of bottomed holes 63x and a plurality of bottomed holes 63y. The bottomed holes 63x cave in from an upper surface toward an approximately central part in a thickness direction of the intermediate metal layer 63. The bottomed holes 63y cave in from a lower surface toward the approximately central part in the thickness direction of the intermediate metal layer 63.

The bottomed holes 63x and the bottomed holes 63y are alternately arranged in the X-direction in the plan view. In addition, the bottomed holes 63x and the bottomed holes 63y are alternately arranged in a Y-direction in the plan view. The bottomed holes 63x and the bottomed holes 63y that are alternately arranged in the X-direction, partially overlap in the plan view, and the partially overlapping parts of the bottomed hole 63x and the bottomed hole 63y communicate with each other to form a pore 63z. Further, the bottomed holes 63x and the bottomed holes 63y that are alternately arranged in the Y-direction, partially overlap in the plan view, and the partially overlapping parts of the bottomed hole 63x and the bottomed hole 63y communicate with each other to form the pore 63z. In other words, the bottomed holes 63x partially communicate with the bottomed holes 63y, to form the pores 63z.

In addition, the bottomed hole 62y and the bottomed hole 63x partially overlap in the plan view, and the partially overlapping parts of the bottomed hole 62y and the bottomed hole 63x communicate with each other to form a pore 67z. In other words, the bottomed holes 62y partially communicate with the bottomed holes 63x, to form the pores 67z.

Similarly, the inlet passage 680 side of an end of the wall portions 641 and 642 of the intermediate metal layer 64 includes a plurality of bottomed holes 64x and a plurality of bottomed holes 64y. The bottomed holes 64x cave in from an upper surface toward an approximately central part in a thickness direction of the intermediate metal layer 64. The bottomed holes 64y cave in from a lower surface toward the approximately central part in the thickness direction of the intermediate metal layer 64.

The bottomed holes 64x and the bottomed holes 64y are alternately arranged in the X-direction in the plan view. In addition, the bottomed holes 64x and the bottomed holes 64y are alternately arranged in a Y-direction in the plan view. The bottomed holes 64x and the bottomed holes 64y that are alternately arranged in the X-direction, partially overlap in the plan view, and the partially overlapping parts of the bottomed hole 64x and the bottomed hole 64y communicate with each other to form a pore 64z. Further, the bottomed holes 64x and the bottomed holes 64y that are alternately arranged in the Y-direction, partially overlap in the plan view, and the partially overlapping parts of the bottomed hole 64x and the bottomed hole 64y communicate with each other to form the pore 64z. In other words, the bottomed holes 64x partially communicate with the bottomed holes 64y, to form the pores 64z.

In addition, the bottomed hole 63y and the bottomed hole 64x partially overlap in the plan view, and the partially overlapping parts of the bottomed hole 63y and the bottomed hole 64x communicate with each other to form a pore 68z. In other words, the bottomed holes 63y partially communicate with the bottomed holes 64x, to form the pores 68z.

Similarly, the inlet passage 680 side of an end of the wall portions 651 and 652 of the intermediate metal layer 65 includes a plurality of bottomed holes 65x and a plurality of bottomed holes 65y. The bottomed holes 65x cave in from an upper surface toward an approximately central part in a thickness direction of the intermediate metal layer 65. The bottomed holes 65y cave in from a lower surface toward the approximately central part in the thickness direction of the intermediate metal layer 65.

The bottomed holes 65x and the bottomed holes 65y are alternately arranged in the X-direction in the plan view. In addition, the bottomed holes 65x and the bottomed holes 65y are alternately arranged in a Y-direction in the plan view. The bottomed holes 65x and the bottomed holes 65y that are alternately arranged in the X-direction, partially overlap in the plan view, and the partially overlapping parts of the bottomed hole 65x and the bottomed hole 65y communicate with each other to form a pore 65z. Further, the bottomed holes 65x and the bottomed holes 65y that are alternately arranged in the Y-direction, partially overlap in the plan view, and the partially overlapping parts of the bottomed hole 65x and the bottomed hole 65y communicate with each other to form the pore 65z. In other words, the bottomed holes 65x partially communicate with the bottomed holes 65y, to form the pores 65z.

In addition, the bottomed hole 64y and the bottomed hole 65x partially overlap in the plan view, and the partially overlapping parts of the bottomed hole 64y and the bottomed hole 65x communicate with each other to form a pore 69z. In other words, the bottomed holes 64y partially communicate with the bottomed holes 65x, to form the pores 69z.

FIG. 3B illustrates an example of an arrangement of the bottomed holes in the intermediate metal layer 62, however, the arrangements of the bottomed holes in each of the intermediate metal layers 63 through 65 may be similar to the arrangement of the bottomed holes in the intermediate metal layer 62. In addition, in each of the intermediate metal layers 63 through 65, the gap (or distance) between two mutually adjacent bottomed holes along the X-direction, the gap (or distance) between two mutually adjacent bottomed holes along the Y-direction, the shape of the inner walls of the bottomed holes, the width of the pore along the longitudinal direction, and the width of the pore along the lateral direction may be similar to the corresponding gaps $L_1$ and $L_2$ of the bottomed holes 62x and 62y and the corresponding widths $W_3$ and $W_4$ of the pore 62z in the intermediate metal layer 62.

The arrangements and the dimensions of the bottomed holes and the pores described above are merely examples. The arrangements of the bottomed holes in the intermediate metal layers 63 through 65 do not necessarily have to be similar to the arrangements of the bottomed holes 62x and 62y in the intermediate metal layer 62. The arrangements of the bottomed holes in the intermediate metal layers 63 through 65 may be arbitrary, as long as the bottomed holes formed in adjacent parts of two successively stacked (or mutually contacting upper and lower) intermediate metal layers include overlapping regions in the plan view such that the overlapping regions of the bottomed holes form the pores. In addition, in each of the intermediate metal layers 63 through 65, specifications for the gap (or distance) between two mutually adjacent bottomed holes along the X-direction, the gap (or distance) between two mutually adjacent bottomed holes along the Y-direction, the shape of the inner walls of the bottomed holes, the width of the pore along the longitudinal direction, and the width of the pore along the lateral direction may be different from the specifications for the corresponding gaps $L_1$ and $L_2$ of the bottomed holes 62x and 62y and the corresponding widths $W_3$ and $W_4$ of the pore 62z in the intermediate metal layer 62.

The pores 62z, 63z, 64z, and 65z formed in each of the intermediate metal layers 62 through 65 communicate with each other, and these mutually communicating pores 62z, 63z, 64z, and 65z spread three-dimensionally inside the porous body 600. For this reason, the working fluid C spreads three-dimensionally within the mutually communicating pores 62z, 63z, 64z, and 65z due to capillary force.

[Method of Manufacturing Loop Heat Pipe in First Embodiment]

Next, a method of manufacturing the loop heat pipe in the first embodiment will be described, by focusing on manufacturing stages of the porous body. FIG. 4A, FIG. 4B, FIG. 4C, FIG. 4D, FIG. 5A, and FIG. 5B are diagrams illustrating an example of the manufacturing stages of the loop heat pipe in the first embodiment, and illustrate cross sections corresponding to FIG. 3A.

First, in the manufacturing stage illustrated in FIG. 4A, a metal sheet 620 that is formed to the planar shape illustrated in FIG. 1 is prepared. A resist layer 310 is formed on an upper surface of the metal sheet 620, and a resist layer 320 is formed on a lower surface of the metal sheet 620. The metal sheet 620 is a member that finally becomes the intermediate metal layer 62, and may be formed from copper, stainless steel, aluminum, magnesium alloy, or the like, for example. The metal sheet 620 may have a thickness of approximately 50 μm to approximately 200 μm, for example. For example, a photosensitive dry film resist or the like may be used for the resist layers 310 and 320.

Next, in the manufacturing stage illustrated in FIG. 4B, the resist layer 310 in a region of the metal sheet 620 where the porous body 600 is to be formed (a region that becomes a sidewall of the inlet 60) is exposed and developed, to form an opening 310x that selectively exposes the upper surface of the metal sheet 620. In addition, the resist 320 is exposed and developed, to form an opening 320x that selectively exposes the lower surface of the metal sheet 620. The openings 310x and 320x are formed to have shapes and arrangements corresponding to the shapes and the arrangements of the bottomed holes 62x and 62y illustrated in FIG. 3B.

Next, in the manufacturing stage illustrated in FIG. 4C, the metal sheet 620 exposed within the opening 310x is half-etched from the upper surface of the metal sheet 620, and the metal sheet 620 exposed within the opening 620x is half-etched from the lower surface of the metal sheet 620.

Hence, the bottomed hole 62x is formed at the upper surface of the metal sheet 620, and the bottomed hole 62y is formed at the lower surface of the metal sheet 620. In addition, because the opening 310x at the upper surface of the metal sheet 620 and the opening 320x at the lower surface of the metal sheet 620 are alternately arranged in the X-direction and the Y-direction, and partially overlap in the plan view, the partially overlapping parts communicate with each other to form the pore 62z. Further, the metal sheet 620 forms an opening at a central part along the X-direction, and the wall portions 621 and 622 are formed at positions separated along the X-direction. The half-etching of the metal sheet 620 may use a ferric chloride solution, for example.

Next, in the manufacturing stage illustrated in FIG. 4D, the resist layers 310 and 320 are stripped using a stripping agent. As a result, the intermediate metal layer 62 is completed.

Next, in the manufacturing stage illustrated in FIG. 5A, the outermost metal layers 61 and 66, that are continuous layers having no holes or grooves, are prepared. In addition, the intermediate metal layers 63, 64, and 65 are formed by a method similar to the above described method of forming the intermediate metal layer 62. The bottomed holes and the pores in the intermediate metal layers 63, 64, and 65 may be similar to the bottomed holes 62$x$ and 62$y$ and the pores 62$z$ in the intermediate metal layer 62 illustrated in FIG. 3B.

Next, in the manufacturing stage illustrated in FIG. 5B, the outermost metal layer 61, the intermediate metal layers 62 through 65, and the outermost metal layer 66 are stacked in the order illustrated in FIG. 5A, and are bonded by solid-phase bonding, such as solid-phase welding or the like, for example. The solid-phase bonding may include pressing and heating. As a result, the adjacent metal layers are directly bonded to each other, to complete the loop heat pipe 1 having the evaporator 10, the condenser 20, the vapor pipe 30, the liquid pipe 40, and the inlet 60, in which the porous body 600 is formed at the sidewalls of the inlet 60. In addition, the passage 50 is formed by the vapor pipe 30 and the liquid pipe 40.

The solid-phase (or solid-state) welding refers to a method of bonding two welding targets together in the solid-phase (or solid-state), without melting the two welding targets, by heating, softening, and pressing the welding targets to cause plastic deformation. Preferably, the outermost metal layer 61, the intermediate metal layers 62 through 65, and the outermost metal layer 66 are all made of the same material, so that the mutually adjacent metal layers can be satisfactorily bonded by the solid-phase (or solid-state) welding.

Thereafter, a vacuum pump or the like is used to exhaust or purge the inside of the liquid pipe 40, and the working fluid C is filled into the liquid pipe 40 from the inlet 60. Then, the sealed portion 60$b$ is formed by pressing and flattening the end part of the inlet 60, to hermetically seal the working fluid C filled inside the liquid pipe 40 so as not to leak to the outside.

Figure 6A:
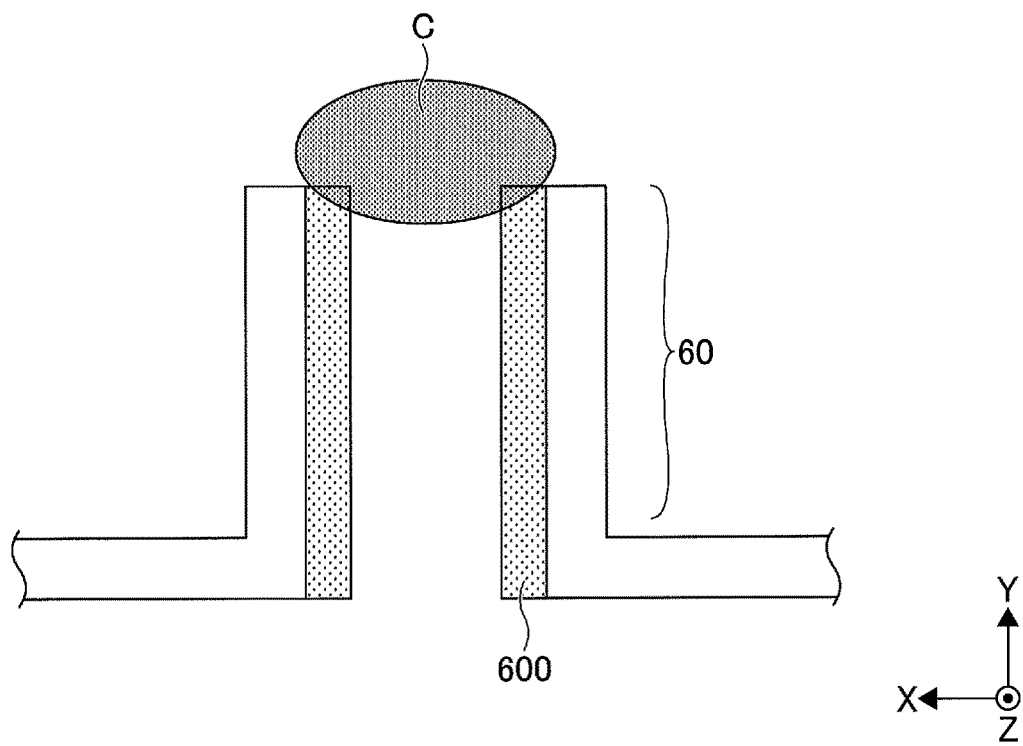
FIG. 6A and FIG. 6B are diagrams for explaining a state in which a working fluid is filled from the inlet.
Figure 6B:
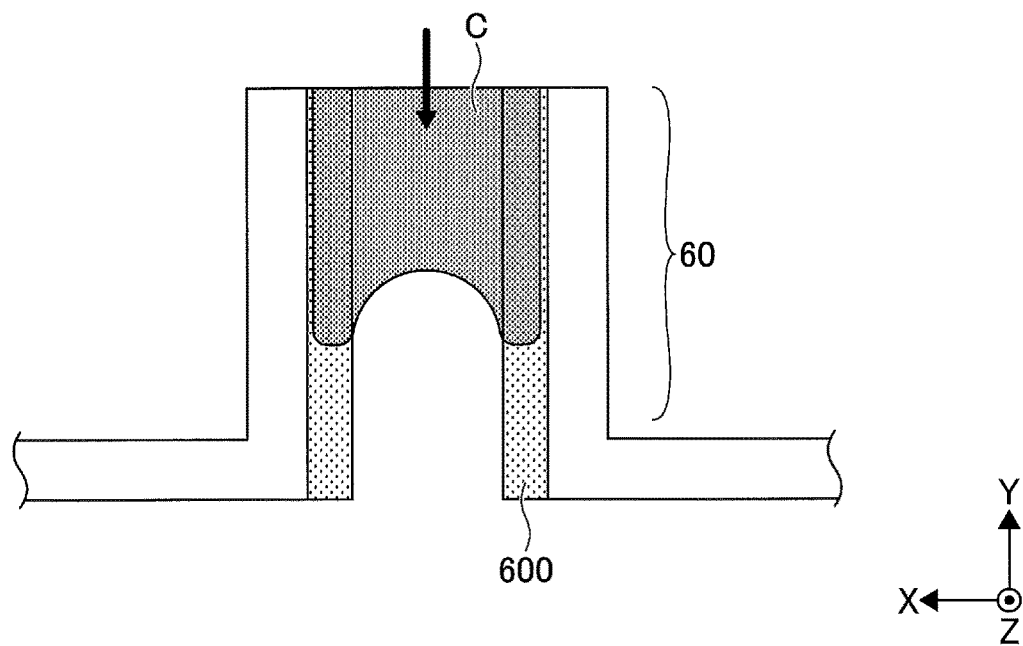

FIG. 6A and FIG. 6B are diagrams for explaining a state in which the working fluid is filled from the inlet. In the loop heat pipe 1, the capillary force is generated by the porous body 600 that is formed at the sidewalls of the inlet 60. For this reason, when the working fluid C is filled from the inlet 60 as illustrated in FIG. 6A, the working fluid C is first drawn in by the porous body 600 at both the sidewalls of the inlet 60. Thereafter, the working fluid C is drawn in while forming a meniscus between both the sidewalls of the inlet 60, to follow the working fluid C that is drawn in at both the sidewalls of the inlet 60.

Accordingly, the working fluid C can easily be drawn in inside the loop heat pipe 1, due to the capillary force of the porous body 600. For this reason, even in a case in which the loop heat pipe 1 is made thin and the inlet 60 for filling the working fluid C accordingly becomes small, a very small amount of the working fluid C can be stably drawn in inside the loop heat pipe 1. In addition, because the very small amount of the working fluid C can be stably drawn inside the loop heat pipe 1, it is possible to improve controllability of a filling amount of the working fluid C, and easily fill a desired amount of the working fluid C.

Further, the porous body 600 is configured to partially communicate the bottomed holes formed from both the upper and lower surfaces of each of the intermediate metal layers 62 through 65, so as to provide the pores in each of the intermediate metal layers 62 through 65. Accordingly, unlike a case in which metal layers formed with through-holes are stacked so that the through-holes of the adjacent metal layers partially overlap, a positional error will not occur when stacking the adjacent metal layers, and a positional error will not occur due to expansion and contraction of the metal layers due to a heating process (or heat treatment) that is performed when stacking the plurality of metal layers. For this reason, it is possible to form the pores having a constant size in each of the intermediate metal layers 62 through 65. Consequently, it is possible to prevent a decrease in the capillary force that would otherwise occur if the size of the pores were inconsistent, and the very small amount of the working fluid C can be stably drawn in inside the loop heat pipe 1.

First Modification of First Embodiment

In a first modification of the first embodiment, the arrangements of the bottomed holes at the porous body are different from those of the first embodiment, for example. In the first modification of the first embodiment, those parts that are the same as those corresponding parts of the first embodiment described above are designated by the same reference numerals, and a description thereof may be omitted.

Figure 7:
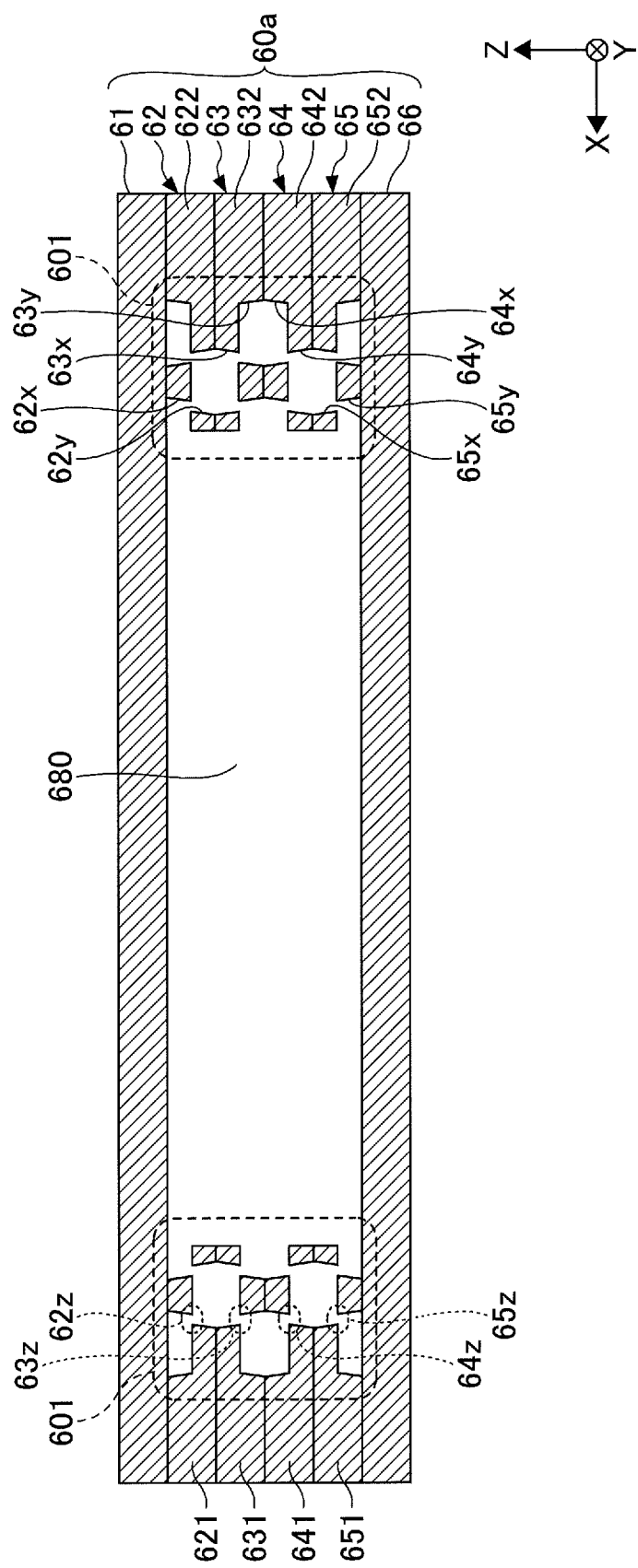
FIG. 7 is a diagram illustrating an example of the structure of the inlet of the loop heat pipe in a first modification of the first embodiment.

FIG. 7 is a diagram illustrating an example of the structure of the inlet of the loop heat pipe in the first modification of the first embodiment, and illustrates a cross section corresponding to FIG. 3A.

A porous body 601 illustrated in FIG. 7 differs from the porous body 600 illustrated in FIG. 3A in that, at the porous body 601, the bottomed holes formed in the adjacent parts of the intermediate metal layers 62 through 65 are arranged at overlapping positions in the plan view.

More particularly, the bottomed hole 62$y$ in the intermediate metal layer 62 and the bottomed hole 63$x$ in the intermediate metal layer 63, the bottomed hole 63$y$ in the intermediate metal layer 63 and the bottomed hole 64$x$ in the intermediate metal layer 64, and the bottomed hole 64$y$ in the intermediate metal layer 64 and the bottomed hole 65$x$ in the intermediate metal layer 65 are arranged at overlapping positions in the plan view and communicate with each other.

In other words, the parts where the adjacent intermediate metal layers are stacked are configured so that the adjacent bottomed holes as a whole overlap. As a result, mutually contacting areas of the intermediate metal layers can be made large, and a strong bonding of the intermediate metal layers becomes possible. Other effects obtainable in this first modification of the first embodiment are the same as the effects obtainable in the first embodiment described above.

Second Modification of First Embodiment

In a second modification of the first embodiment, the bottomed holes are also formed in the outermost metal layers at the porous body, for example. In the second modification of the first embodiment, those parts that are the same as those corresponding parts of the first embodiment described above are designated by the same reference numerals, and a description thereof may be omitted.

Figure 8:
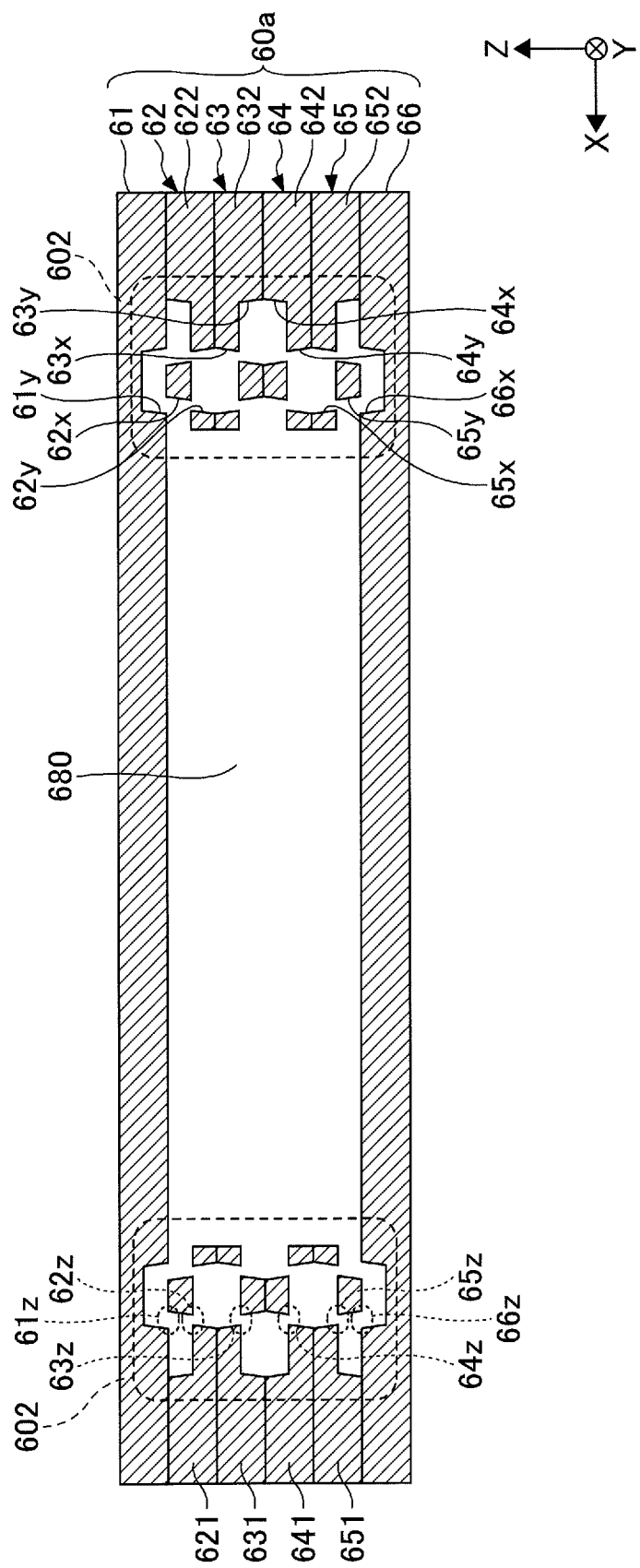
FIG. 8 is a diagram illustrating an example of the structure of the inlet of the loop heat pipe in a second modification of the first embodiment.

FIG. 8 is a diagram illustrating an example of the structure of the inlet of the loop heat pipe in the second modification of the first embodiment, and illustrates a cross section corresponding to FIG. 3A.

A porous body 602 illustrated in FIG. 8 differs from the porous body 601 illustrated in FIG. 7 in that, the bottomed holes are also formed in the outermost metal layers 61 and 66.

More particularly, the outermost metal layer 61 includes bottomed holes 61y that cave in from a lower surface toward the approximately central part in the thickness direction of the outermost metal layer 61. The bottomed holes 61y may be formed at positions overlapping the bottomed holes 62y in the plan view, for example. The bottomed holes 61y and the bottomed holes 62x partially overlap in the plan view, and the partially overlapping parts of the bottomed hole 61y and the bottomed hole 62x communicate with each other to form a pore 61z. In other words, the bottomed holes 61y partially communicate with the bottomed holes 62x, to form the pores 61z.

In addition, the outermost metal layer 66 includes bottomed holes 66x that cave in from an upper surface toward the approximately central part in the thickness direction of the outermost metal layer 66. The bottomed holes 66x may be formed at positions overlapping the bottomed holes 65x in the plan view, for example. The bottomed holes 66x and the bottomed holes 65y partially overlap in the plan view, and the partially overlapping parts of the bottomed hole 66x and the bottomed hole 65y communicate with each other to form a pore 66z. In other words, the bottomed holes 66x partially communicate with the bottomed holes 65y, to form the pores 66z.

Accordingly, at the porous body 602, the bottomed holes 61y are formed in the outermost metal layer 61, forming one outermost layer, at the lower surface of the outermost metal layer 61 in contact with the intermediate metal layer 62. The bottomed holes 61y partially communicate with the bottomed holes 62x formed in the intermediate metal layer 62, to provide the pore 61z. On the other hand, at the porous body 602, the bottomed holes 66x are formed in the outermost metal layer 66, forming the other outermost layer, at the upper surface of the outermost metal layer 66 in contact with the intermediate metal layer 65. The bottomed holes 66x partially communicate with the bottomed holes 65y formed in the intermediate metal layer 65, to provide the pore 66z.

Hence, it is possible to increase the number of pores in the porous body 602 when compared to the number of pores in the porous body 601, to thereby further improve the capillary force generated by the pores. As a result, even in the case in which the loop heat pipe 1 is made thin and the inlet 60 for filling the working fluid C accordingly becomes small, a very small amount of the working fluid C can be stably drawn in inside the loop heat pipe 1.

In the porous body 600 illustrated in FIG. 3A, it is possible to form the bottomed holes 61y in the outermost metal layer 61 forming one outermost layer and contacting the intermediate metal layer 62, and form the bottomed holes 66x in the outermost metal layer 66 forming the other outermost layer and contacting the intermediate metal layer 65, similarly as in the case of the porous body 602. In this case, it is possible to obtain effects similar to the effects obtainable by the porous body 602 described above.

Third Modification of First Embodiment

In a third modification of the first embodiment, through-holes are used in place of the bottomed holes, for example.

In the third modification of the first embodiment, those parts that are the same as those corresponding parts of the first embodiment described above are designated by the same reference numerals, and a description thereof may be omitted.

Figure 9:
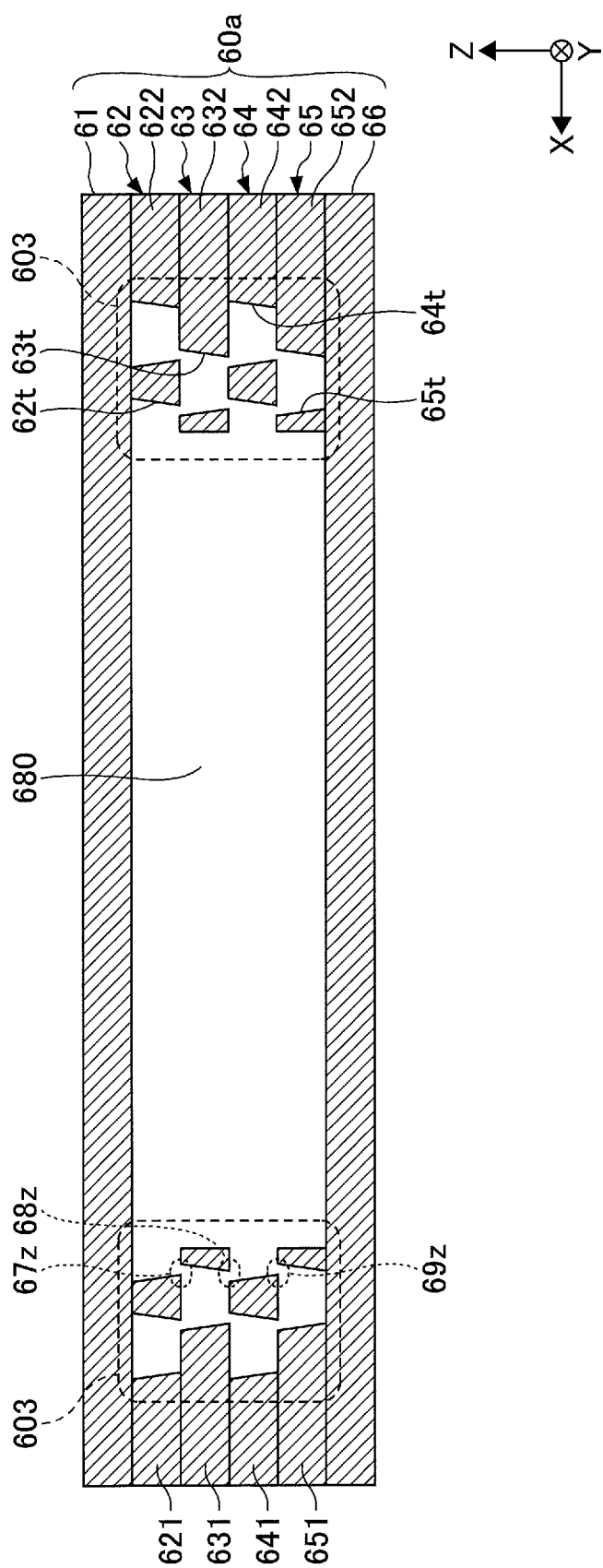
FIG. 9 is a diagram illustrating an example of the structure of the inlet of the loop heat pipe in a third modification of the first embodiment.

FIG. 9 is a diagram illustrating an example of the structure of the inlet of the loop heat pipe in the third modification of the first embodiment, and illustrates a cross section corresponding to FIG. 3A.

A porous body 603 illustrated in FIG. 9 differs from the porous body 600 illustrated in FIG. 3A in that, the through-holes are provided in place of the bottomed holes in the intermediate metal layers 62 through 65, and the through-holes in the adjacent intermediate metal layers partially communicate with each other.

More particularly, a plurality of through-holes 62t that penetrate in the thickness direction of the intermediate metal layer 62 are formed at the inlet passage 680 side of an end of the wall portions 621 and 622 of the intermediate metal layer 62. A plurality of through-holes 63t that penetrate in the thickness direction of the intermediate metal layer 63 are formed at the inlet passage 680 side of an end of the wall portions 631 and 632 of the intermediate metal layer 63. A plurality of through-holes 64t that penetrate in the thickness direction of the intermediate metal layer 64 are formed at the inlet passage 680 side of an end of the wall portions 641 and 642 of the intermediate metal layer 64. A plurality of through-holes 65t that penetrate in the thickness direction of the intermediate metal layer 65 are formed at the inlet passage 680 side of an end of the wall portions 651 and 652 of the intermediate metal layer 65. The arrangements and the shapes of the through-holes in the plan view at the porous body 603 may be the same as the arrangements and the shapes of the bottomed holes in the plan view at the porous body 600.

The through-holes 62t and the through-holes 63t partially overlap in the plan view, and the partially overlapping parts of the through-hole 62t and the through-hole 63t form a pore 67z. In addition, the through-holes 63t and the through-holes 64t partially overlap in the plan view, and the partially overlapping parts of the through-hole 63t and the through-hole 64t form a pore 68z. The through-holes 64t and the through-holes 65t partially overlap in the plan view, and the partially overlapping parts of the through-hole 64t and the through-hole 65t form a pore 69z.

In order to form each of the through-holes, the openings 310x and 320x may be formed at overlapping positions in the plan view in the manufacturing stage described above in conjunction with FIG. 4B, and the metal sheet 620 exposed within the opening 310x and the metal sheet 620 exposed within the opening 320x may be etched in the manufacturing state described above in conjunction with FIG. 4C.

Accordingly, the through-holes may be provided in place of the bottomed holes, and the through-holes in the adjacent intermediate metal layers may partially communicate with each other to form the pore. In this case, it is possible to obtain effects similar to the effects obtainable in the first embodiment described above. However, from a viewpoint that the positional error will not occur when stacking the adjacent metal layers, and the positional error will not occur due to expansion and contraction of the metal layers due to a heating process (or heat treatment) that is performed when stacking the plurality of metal layers, it is more preferable to provide the porous bodies 600 through 602 when compared to providing the porous body 603.

Second Embodiment

In a second embodiment, the present invention is applied to a flat heat pipe, for example. In the second embodiment, those parts that are the same as those corresponding parts of the first embodiment described above are designated by the same reference numerals, and a description thereof may be omitted.

Figure 10:
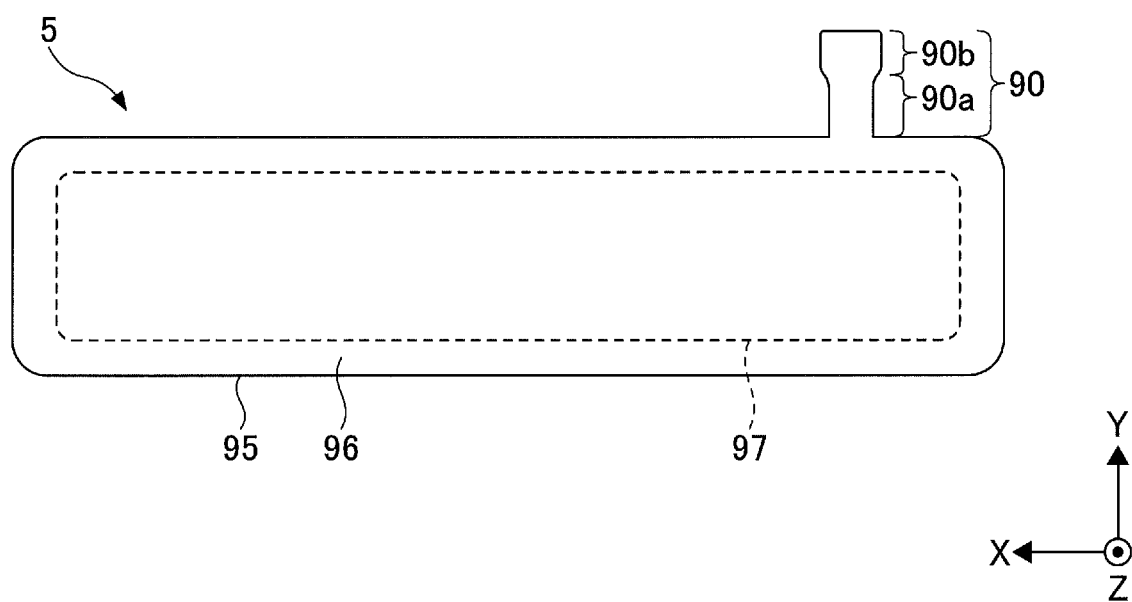
FIG. 10 is a plan view schematically illustrating an example of a flat heat pipe in a second embodiment.

FIG. 10 is a plan view schematically illustrating an example of the flat heat pipe in the second embodiment.

As illustrated in FIG. 10, a flat heat pipe 5 may have a structure in which a wick 96 is provided on an inner wall of an outer casing 95. A vapor passage 97 is formed on an inner side of the wick 96. The wick 96 generates the capillary force for circulating the working fluid condensed by the condenser to the evaporator. The working fluid that becomes vapor at the evaporator, passes through the vapor passage 97, and moves to the condenser.

In the flat heat pipe 5, a location on the outer casing 95 where the heat generating component, such as the semiconductor device or the like, is arranged, becomes an evaporator part (heat generating part). A location separated from the evaporator part becomes a condenser part. A location between the evaporator part and the condenser part becomes a heat insulating part. For example, when the heat generating component is arranged in a vicinity of a right end part of the outer casing 95 illustrated in FIG. 10, the vicinity of the right end part of the outer casing 95 becomes the evaporator part. In this case, a vicinity of a left end part of the outer casing 95 becomes the condenser part, and a vicinity of a central part of the outer casing 95 becomes the heat insulating part.

A inlet 90 for filling the working fluid into the wick 96 is provided on the outer casing 95. The inlet 90 includes a non-sealed portion 90a and a sealed portion 90b. The non-sealed portion 90a, and the sealed portion 90b before being pressed and flattened, includes the porous body 600 having a structure similar to that illustrated in FIG. 3A.

By providing the inlet 90 having the same structure as filling hole 60 in the flat heat pipe 5, effects similar to the effects obtainable in the first embodiment described above can be obtained by the porous body 600. Of course, any one of the porous bodies 601, 602, and 603 may be provided at the inlet 90 in place of the porous body 600.

Although the embodiments and the modifications are numbered with, for example, "first," "second," etc., the ordinal numbers do not imply priorities of the embodiments and modifications. Many other variations and modifications will be apparent to those skilled in the art.

In each of the embodiments and the modifications described above, the porous body is provided at both of the two opposing wall portions of each of the intermediate metal layers. However, the porous body may be provided at only one of the two opposing wall portions of each of the intermediate metal layers.

In addition, the porous body need not be provided in all of the intermediate metal layers. For example, it is possible not to provide the porous body in the intermediate metal layers 62 and 65, and to provide the porous body at one of the two opposing wall portions or at both of the two opposing wall portions of the intermediate metal layers 63 and 64. In this case, the intermediate metal layers 62 and 65 include no bottomed holes or no through-holes.

The porous body does not necessarily have to be integrally formed in the intermediate metal layers. For example, a porous body, that is separate from the intermediate metal layers, may be inserted into the inlet and provided on the wall portions of the intermediate metal layers.

According to the embodiments and the modifications, it is possible to provide a heat pipe and a method of manufacturing the heat pipe, which can stably fill the working fluid into the heat pipe.

Various aspects of the subject-matter described herein may be set out non-exhaustively in the following numbered clauses:

1. A method of manufacturing a heat pipe that includes an inlet for filling a working fluid into the heat pipe, and including a first outermost metal layer, a second outermost metal layer, an intermediate metal layer interposed between the first and second outermost metal layers, an inlet passage defined by opposing wall portions of the intermediate metal layer and the first and second outermost metal layers, and a porous body provided at one or both of the wall portions, the method comprising:

forming the intermediate metal layer to form the porous body, wherein the forming includes half-etching a metal sheet from one surface of the metal sheet to form a first bottomed hole that caves in from the one surface of the metal sheet, and half-etching the metal sheet from the other surface of the metal sheet to form a second bottomed hole that caves in from the other surface of the metal sheet and partially communicates with the first bottomed hole, to form a pore.

2. A method of manufacturing a heat pipe that includes an inlet for filling a working fluid into the heat pipe, and including a first outermost metal layer, a second outermost metal layer, a plurality of intermediate metal layers that are stacked and interposed between the first and second outermost metal layers, an inlet passage defined by opposing wall portions of the plurality of intermediate metal layers and the first and second outermost metal layers, and a porous body provided at one or both of the wall portions, the method comprising:

forming the plurality of intermediate metal layers to form the porous body, wherein the forming includes etching a first metal sheet to form a first through-hole that penetrates the first metal sheet, etching a second metal sheet to form a second through-hole that penetrates the second metal sheet, and stacking the first metal sheet and the second metal sheet to partially communicate the first through-hole with the second through-hole, to form a pore.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A heat pipe comprising:
an inlet for filling a working fluid into the heat pipe, and including
a first outermost metal layer;
a second outermost metal layer;
an intermediate metal layer interposed between the first and second outermost metal layers;
an inlet passage defined by opposing wall portions of the intermediate metal layer, and the first and second outermost metal layers; and a porous body provided at one or both of the wall portions, wherein the porous body includes a first bottomed hole that caves in from one surface of the intermediate metal layer, a second bottomed hole that caves in from the other surface of the intermediate metal layer, and a pore formed by the first bottomed hole that partially communicates with the second bottomed hole.

2. The heat pipe as claimed in claim 1, wherein the intermediate metal layer includes a plurality of intermediate metal layers including a first intermediate metal layer and a second intermediate metal layer adjacent to the first intermediate metal layer, the porous body includes a first bottomed hole that caves in from one surface of the second intermediate metal layer, a second bottomed hole that caves in from the other surface of the second intermediate metal layer, and a pore formed by the first bottomed hole in the second intermediate metal layer that partially communicates with the second bottomed hole in the second intermediate metal layer, and the second bottomed hole in the first intermediate metal layer partially communicates with the first bottomed hole in the second intermediate metal layer, to form a pore.

3. The heat pipe as claimed in claim 1, wherein the intermediate metal layer includes a plurality of intermediate metal layers including a first intermediate metal layer and a second intermediate metal layer adjacent to the first intermediate metal layer, the porous body includes a first bottomed hole that caves in from one surface of the second intermediate metal layer, a second bottomed hole that caves in from the other surface of the second intermediate metal layer, and a pore formed by the first bottomed hole in the second intermediate metal layer that partially communicates with the second bottomed hole in the second intermediate metal layer, and the second bottomed hole in the first intermediate metal layer and the first bottomed hole in the second intermediate metal layer are formed at overlapping positions in a plan view.

4. The heat pipe as claimed in claim 1, wherein the first outermost metal layer includes a third bottomed hole that caves in from a surface of the first outermost metal layer in contact with the one surface of the intermediate metal layer, and the third bottomed hole partially communicates with the first bottomed hole in the intermediate metal layer, to form a pore.

5. The heat pipe as claimed in claim 4, wherein the second outermost metal layer includes a fourth bottomed hole that caves in from a surface of the second outermost metal layer in contact with the other surface of the intermediate metal layer, and the fourth bottomed hole partially communicates with the second bottomed hole in the intermediate metal layer to form a pore.

6. The heat pipe as claimed in claim 1, further comprising:

an evaporator configured to vaporize the working fluid and generate vapor;

a condenser configured to liquefy the vapor of the working fluid;

a liquid pipe configured to connect the evaporator and the condenser; and a vapor pipe configured to connect the evaporator and the condenser, and form a loop-shaped passage together with the liquid pipe, wherein the inlet is connected to one of the liquid pipe, the condenser, and the vapor pipe.

* * * * *